(12) United States Patent
Choi

(10) Patent No.: US 7,265,026 B2
(45) Date of Patent: Sep. 4, 2007

(54) METHOD OF FORMING A SHALLOW TRENCH ISOLATION STRUCTURE IN A SEMICONDUCTOR DEVICE

(75) Inventor: Chee Hong Choi, Busan (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,517

(22) Filed: Dec. 28, 2004

(65) Prior Publication Data

US 2005/0142800 A1    Jun. 30, 2005

(30) Foreign Application Priority Data

Dec. 30, 2003    (KR) .................... 10-2003-0100492

(51) Int. Cl.
*H01L 21/76* (2006.01)
(52) U.S. Cl. .................... 438/437; 438/700; 438/738; 438/744; 438/757
(58) Field of Classification Search ................ 438/424, 438/435, 437, 700, 736, 738, 744, 757
See application file for complete search history.

(56) References Cited

U.S. PATENT DOCUMENTS 6,417,070 B1 *  7/2002  Ballantine et al. .......... 438/424
6,541,382 B1 *  4/2003  Cheng et al. ............... 438/692

* cited by examiner

*Primary Examiner*—Zandra V. Smith
*Assistant Examiner*—Toniae M. Thomas
(74) *Attorney, Agent, or Firm*—Andrew D. Fortney

(57) ABSTRACT

An isolation method in a semiconductor device is disclosed. The example method sequentially forms a pad oxide layer and a pad nitride layer on a semiconductor substrate, patterns the pad nitride and oxide layers to form an opening exposing a portion of the substrate, and forms a trench in exposed portion of the substrate. The example method also etches the patterned pad nitride layer to extend the opening, carries out SAC oxidation on the extended opening and the trench to provide a rounded corner to an upper corner of the substrate in the vicinity of the trench, and fills the trench with an insulating layer.

10 Claims, 8 Drawing Sheets

METHOD OF FORMING A SHALLOW TRENCH ISOLATION STRUCTURE IN A SEMICONDUCTOR DEVICE

RELATED APPLICATION

This application claims the benefit of Korean Application No. P2003-0100492 filed on Dec. 30, 2003, which is hereby incorporated herein by reference in its entirety.

TECHNICAL FIELD

The present disclosure relates to a semiconductor device and, more particularly, to a semiconductor device isolation method.

BACKGROUND

Generally, shallow trench isolation (hereinafter abbreviated STI) in a semiconductor device plays a role in electrically isolating devices from each other. In STI, a semiconductor substrate is etched in part to form a trench and an insulator fills up the trench to isolate devices from each other. FIGS. 1A to 1F are cross-sectional diagrams depicting a known isolation method in a semiconductor device. Referring to FIG. 1A, a pad oxide layer 2 is formed on a silicon substrate 1, a nitride layer 3 is deposited on the pad oxide layer 2, and a TEOS layer 4 is deposited on the nitride layer 3.

Referring to FIG. 1B, the TEOS, nitride, and pad oxide layers 4, 3, and 2 are etched by photolithography using an ISO mask to expose a surface of the substrate 1 corresponding to a field area. Additionally, the exposed surface of the substrate 1 is etched to form a trench.

Referring to FIG. 1C, an exposed portion of the pad oxide layer 2 is removed by CDE (chemical dry etch) to form an undercut and pull-back is carried out on the exposed nitride layer 3. Subsequently, SAC (sacrificial oxidation is carried out on an inside of the trench to compensate etching damage to the silicon substrate 1 and an oxide layer 5 is then formed on the inside of the trench.

Referring to FIG. 1D, an oxide layer 6 is formed over the substrate including the TEOS layer 4 to fill up the trench and planarization is carried out on the oxide layer 6 by CMP (chemical mechanical polishing) until the TEOS layer 4 is exposed. Subsequently, wet cleaning is carried out on the planarized oxide layer 6 to lower a height of an STI layer 6.

Referring to FIG. 1E, after completion of wet cleaning, a rounded corner having a small radius is formed at an upper corner 8 of the trench and a divot 7 is formed on an upper edge of the STI layer 6.

Referring to FIG. 1F, a gate polysilicon layer 10 is formed on the oxide layer 2 and the STI layer 6 to fill up the divot.

In the known method, CDE is carried out on the pad oxide layer and the pad nitride layer 3 is etched by pull-back to form the undercut beneath the TEOS layer 4, and the trench sidewall corner is rounded by SAC oxidation. However, the known method fails to sufficiently provide the undercut. In case of forming the undercut sufficiently to enlarge the corner rounding, a void occurs in filling up the trench with oxide, and the generated void cracks the TEOS layer on planarizing the filing oxide, whereby device characteristics are degraded. Further, the divot 7 in the vicinity of a boundary of the STI layer 6 brings about RNWE to degrade device characteristics and to lower device throughput.

DETAILED DESCRIPTION

In general, the example method described herein provides an isolation method in a semiconductor device, in which a sufficient undercut between a pad oxide layer and a nitride layer is secured by SAC oxidation to provide an optimal rounded corner and by which a divot-less STI structure is formed to enhance RNWE (reverse narrow width effect) characteristic at an STI (shallow trench isolation) edge portion.

An example isolation method in a semiconductor device includes sequentially forming a pad oxide layer and a pad nitride layer on a semiconductor substrate, patterning the pad nitride and oxide layers to form an opening exposing a portion of the substrate, forming a trench in exposed portion of the substrate, etching the patterned pad nitride layer to extend the opening, carrying out SAC oxidation on the extended opening and the trench to provide a rounded corner to an upper corner of the substrate in the vicinity of the trench, and filling the trench with an insulating layer. Preferably, the patterned pad nitride layer is etched using a H3PO4 solution at 100~200° C. Also, preferably, the opening is extended to a length of 200~500 Å and a radius of the upper corner is adjustable by an extended length of the extended opening.

Figure 1A:
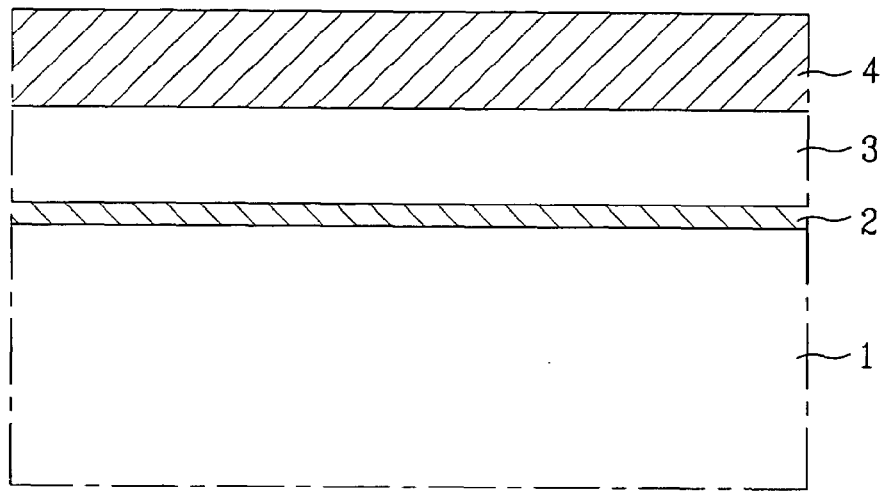
FIGS. 1A to 1F are cross-sectional diagrams depicting a known isolation method in a semiconductor device.
Figure 1B:
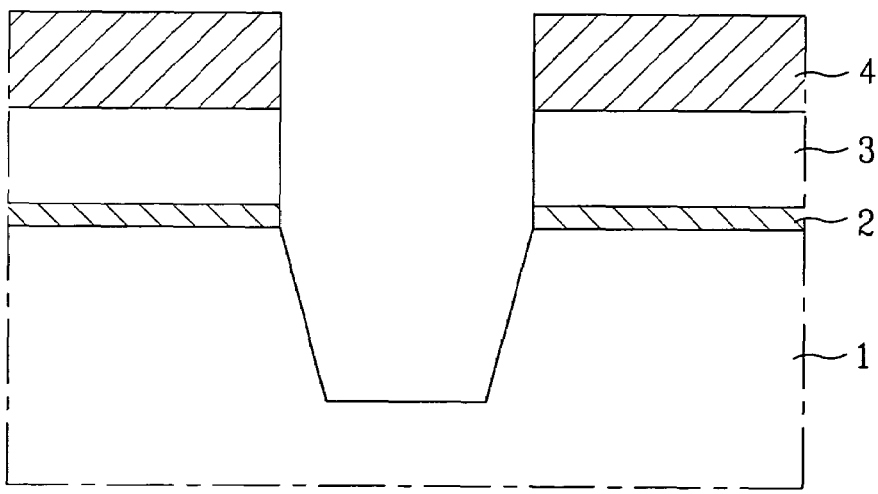
Figure 1C:
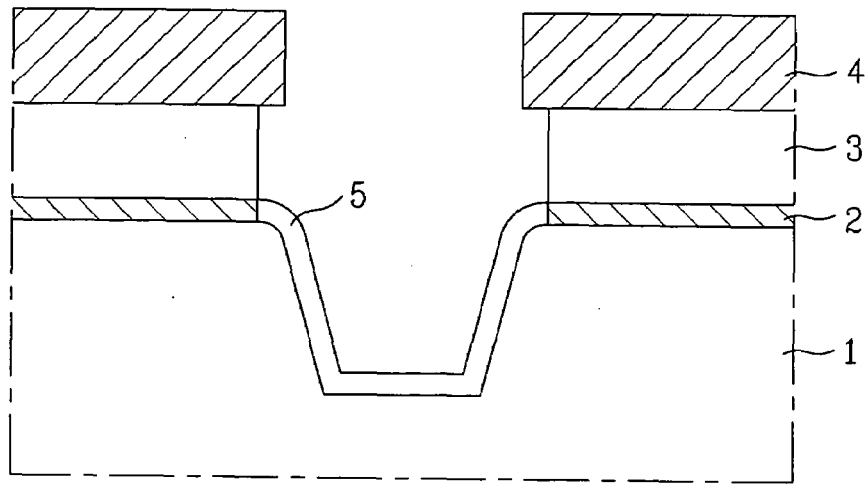
Figure 1D:
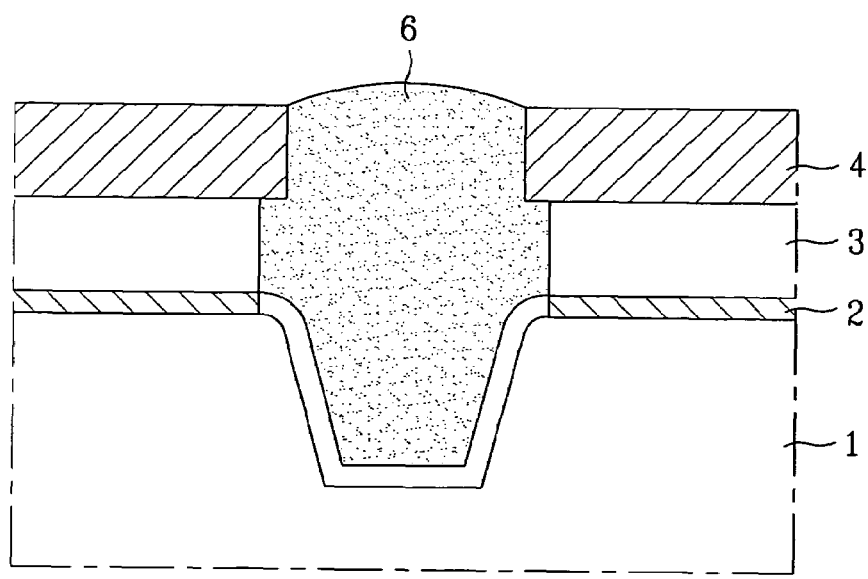
Figure 1E:
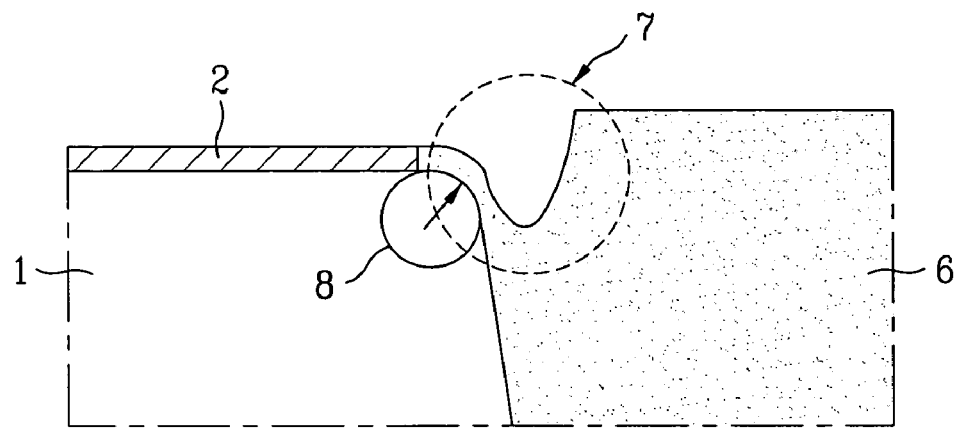
Figure 1F:
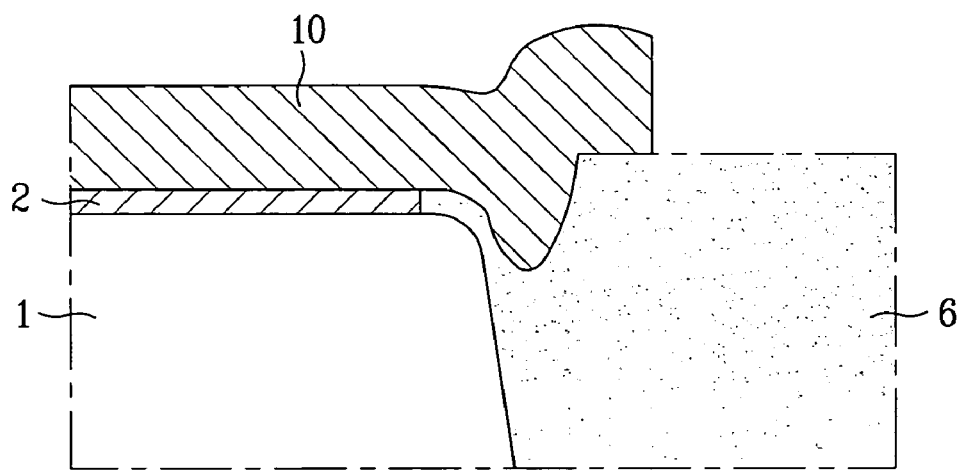
Figure 2A:
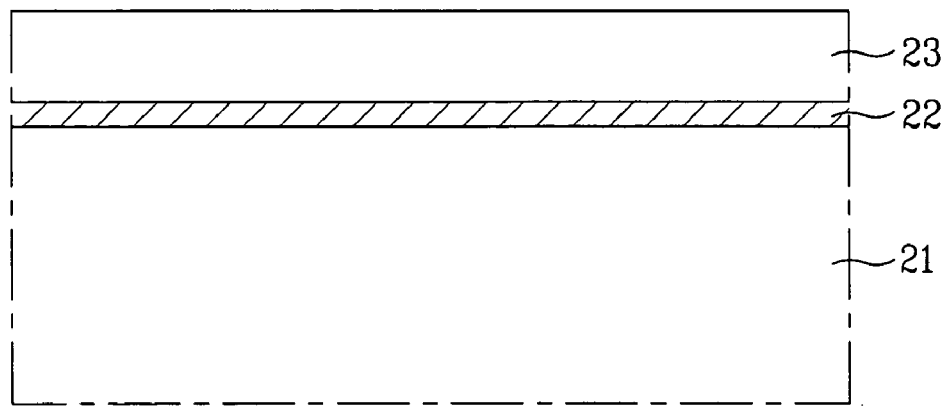
FIGS. 2A to 2F are cross-sectional diagrams depicting an example isolation method in a semiconductor device.
Figure 2B:
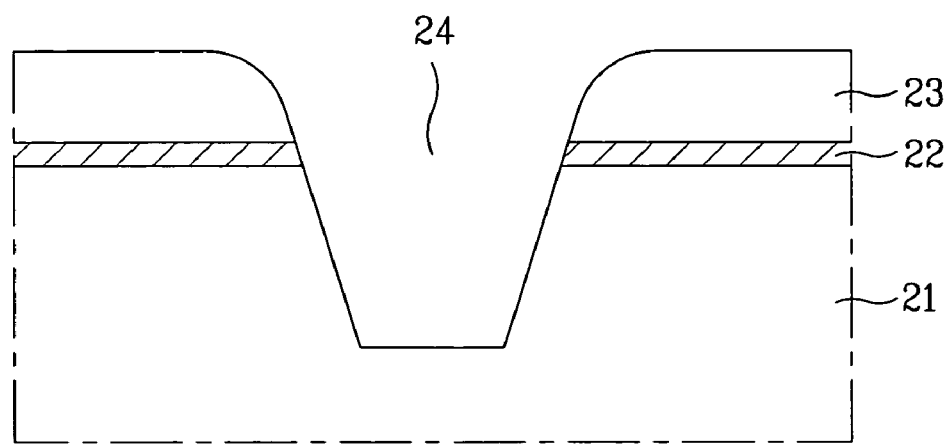
Figure 4A:
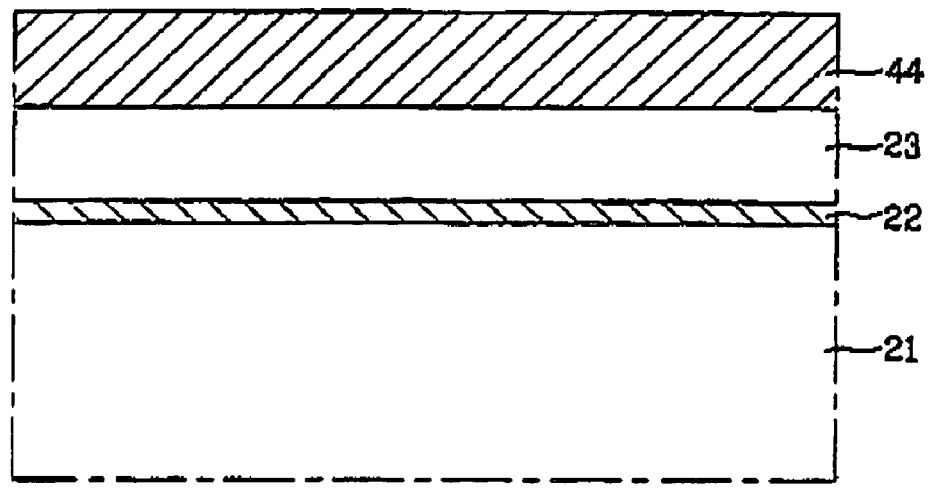
Figure 4B:
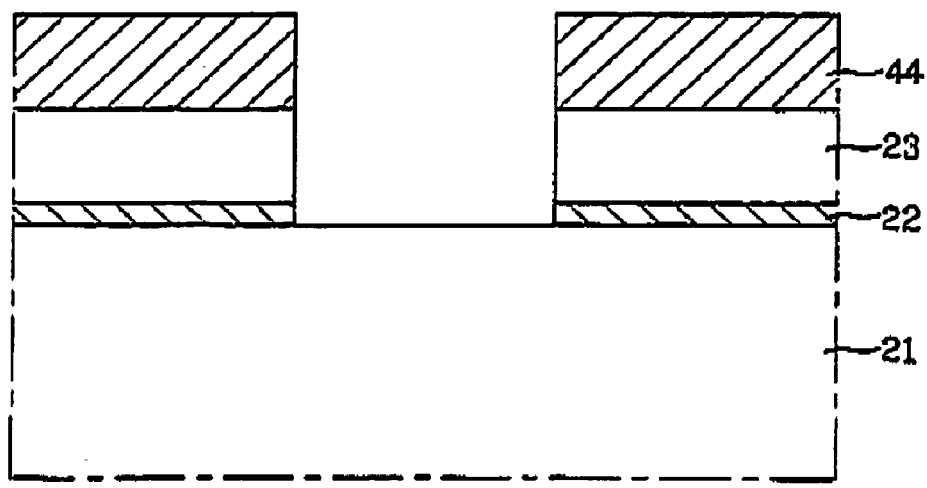

FIGS. 2A to 2F and 4A and 4B are cross-sectional diagrams depicting an example isolation method in a semiconductor device. Referring to FIG. 2A, a pad oxide layer 22 is formed on a silicon substrate 21, and a pad nitride layer 23 is deposited on the pad oxide layer 22. As shown in FIG. 4A, an ISO mask 44 is formed on the pad nitride layer 23. Referring to FIG. 4B, the pad nitride and oxide layers 23 and 22 are etched by photolithography using the ISO mask 44 to expose a surface of the substrate 21 corresponding to a field area, and referring back to FIG. 2B, the exposed surface of the substrate 21 is etched to form a trench 24 and the ISO mask 44 is removed.

Figure 2C:
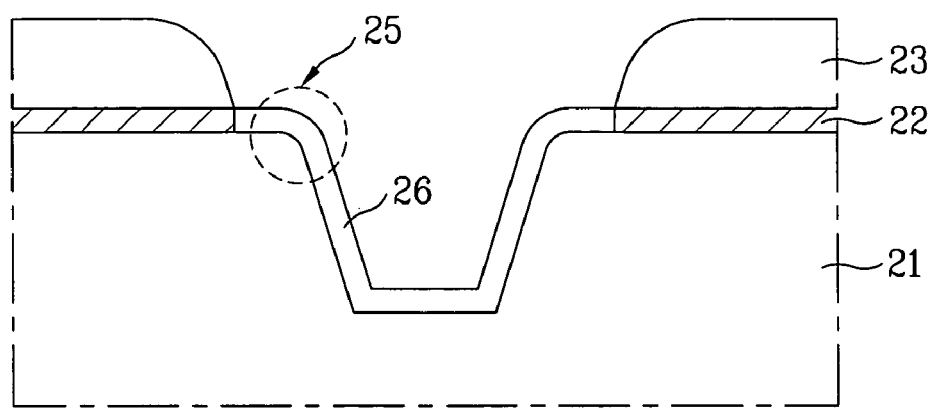

Referring to FIG. 2C, the pad nitride layer 23 is etched using a $H_3PO_4$ solution at 100~200° C. to expose a portion of the substrate 21 in the vicinity of the trench, and an oxide layer 26 is formed by SAC oxidation on an inside of the trench and the exposed portion of the substrate 21 in the vicinity of the trench to form a sufficient undercut area 25 of the pad nitride and oxide layers 23 and 22 to a length 200~500 Å.

Figure 2D:
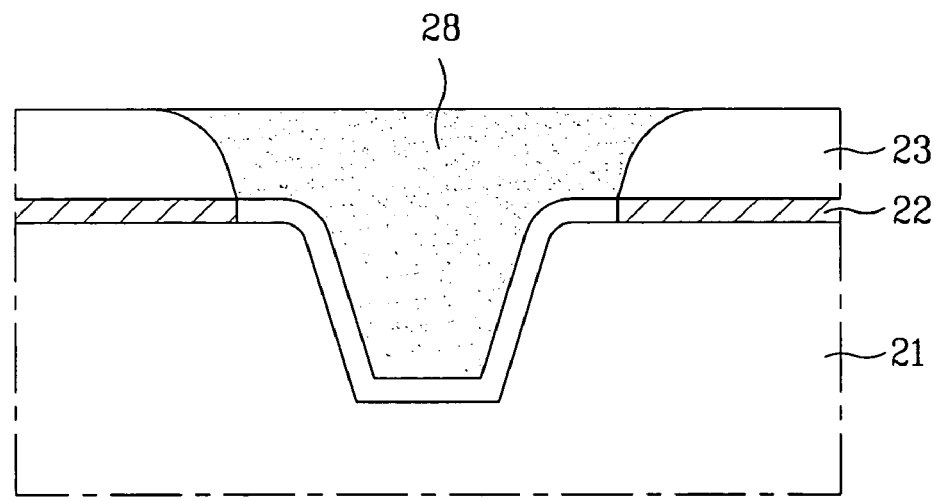

Referring to FIG. 2D, an oxide layer 28 is formed over the substrate to fill up the trench. The oxide layer 28 is then planarized until the pad nitride layer 23 is exposed.

Figure 2E:
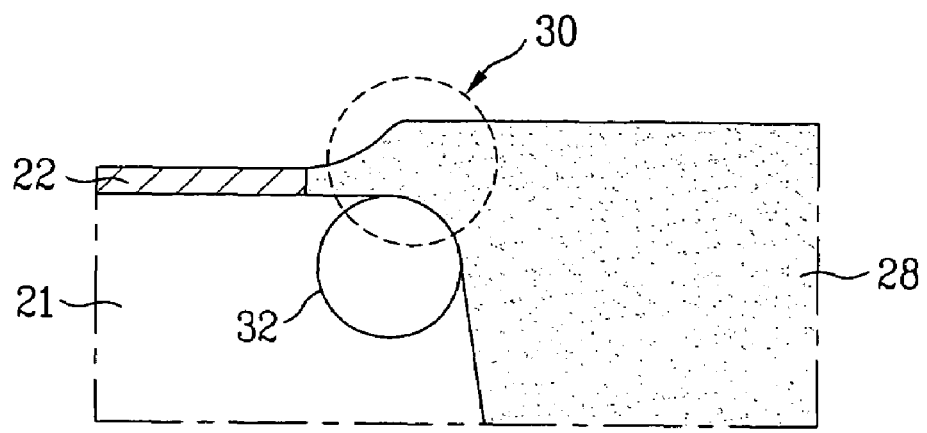

Referring to FIG. 2E, the pad nitride layer is removed. Hence, a rounded corner having a great radius is formed at an upper corner portion 32 of the silicon substrate 21 and there exists no divot on an upper edge 30 of the STI layer 28.

Figure 2F:
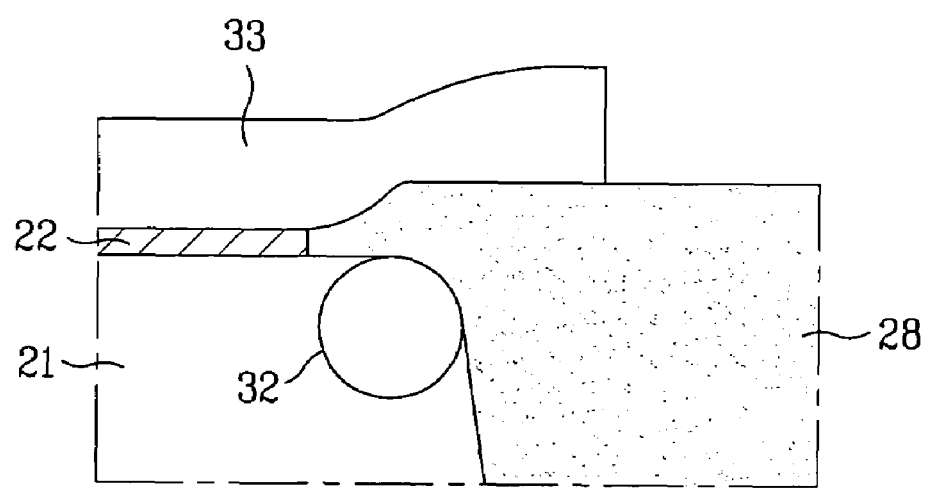

Referring to FIG. 2F, a gate polysilicon layer 33 is formed on the oxide layer 22 and the STI layer 28. Meanwhile, the radius of the rounded corner provided to the upper corner portion is adjustable by the undercut area formed by the etched pad oxide and nitride layers 22 and 23. Namely, by undercutting the pad oxide and nitride layers 22 and 23, the rounded corner having a great radius is provided to the upper corner of trench in the vicinity of the STI layer and the divot is prevented formed on the edge of the STI layer.

Figure 3:
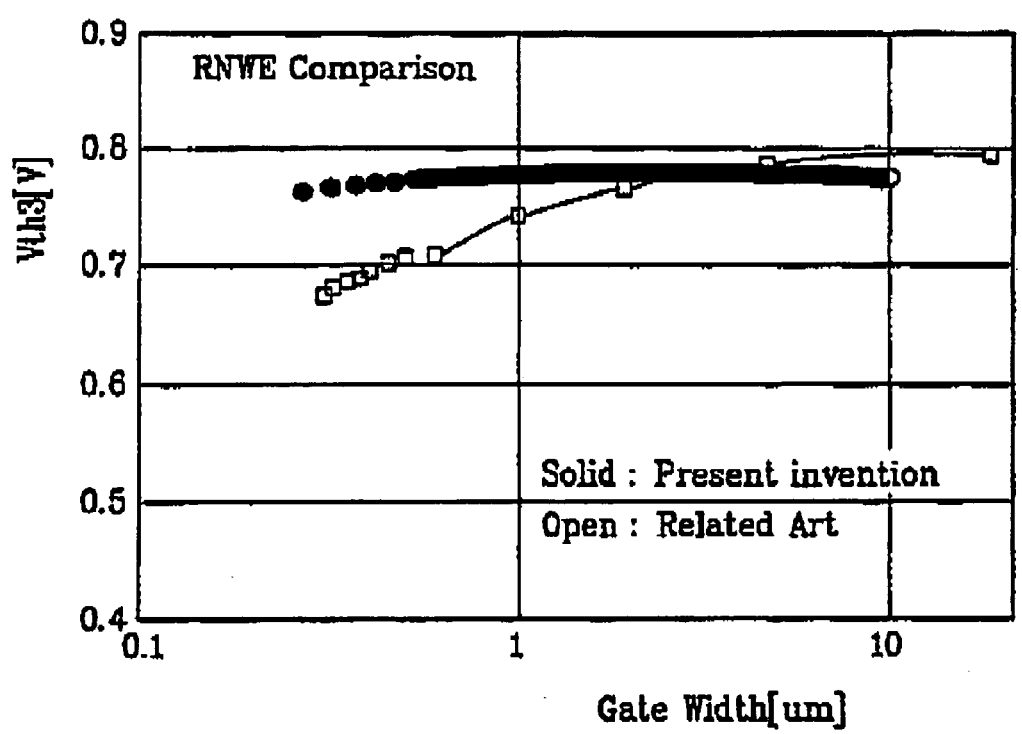
FIG. 3 is an example graph of RNWE (reverse narrow width effect) characteristic.

Thus, the example method reduces an electric field appearing in the vicinity of the gate polysilicon layer to enhance the RNWE characteristics as shown in FIG. 3. As a result, the example method described herein need not employ the known pad TEOS layer and CDE, thereby simplifying the device isolation process. Additionally, the example method provides the divot-free STI layer and the sufficient rounded corner, thereby releasing the stress of the upper edge of the STI layer. As a result, the example method described herein prevents the leakage current, thereby enhancing the RNWE characteristic and throughput.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. An isolation method in a semiconductor device, comprising:
    sequentially forming a pad oxide layer and a pad nitride layer on a substrate;
    forming a mask on the pad nitride layer;
    sequentially etching, by using the mask, the pad nitride and oxide layers to form an opening exposing a portion of the substrate;
    forming a trench in the exposed portion of the substrate;
    removing the mask from the pad nitride layer, wherein the pad nitride layer has rounded corners after removing the mask;
    further selectively etching the etched pad nitride layer to extend the opening;
    carrying out SAC oxidation on the extended opening and the trench to provide a rounded corner to an upper corner of the substrate in the vicinity of the trench; and
    filling the trench with an insulating layer.

2. The isolation method of claim 1, wherein further selectively etching the etched pad nitride layer is performed using a H$_3$PO$_4$ solution at 100~200° C.

3. The isolation method of claim 1, wherein the opening is extended to a length of 200~500 Å.

4. The isolation method of claim 1, wherein a radius of the upper corner is adjustable by an extended length of the extended opening.

5. The isolation method of claim 1, wherein the mask is removed from the pad nitride layer before further selectively etching the etched pad nitride layer.

6. The isolation method of claim 1, wherein the mask is removed from the pad nitride layer after sequentially etching the pad nitride and oxide layers to form the opening exposing the portion of the substrate.

7. The isolation method of claim 1, wherein the opening is extended by a length of 200-500 Å.

8. The isolation method of claim 1, wherein a radius of the upper corner is determined by a distance by which the etched pad nitride layer is further selectively etched.

9. An isolation method in a semiconductor device, comprising:
    sequentially forming a pad oxide layer and a pad nitride layer on a substrate;
    forming a mask on the nad nitride layer;
    sequentially etching, by using the mask, the pad nitride and oxide layers to form an opening exposing a portion of the substrate;
    forming a trench in the exposed portion of the substrate;
    removing the mask from the pad nitride layer;
    further selectively etching the etched pad nitride layer to extend the opening, wherein after sequentially etching the pad nitride and oxide layers and before further selectively etching the etched pad nitride layer, the pad nitride layer has rounded corners;
    carrying out SAC oxidation on the extended opening and the trench to provide a rounded corner to an upper corner of the substrate in the vicinity of the trench; and
    filling the trench with an insulating layer.

10. The isolation method of claim 9, wherein the pad nitride layer has rounded corners after removing the mask.

* * * * *